(12) United States Patent
Seth et al.

(10) Patent No.: US 9,496,007 B2
(45) Date of Patent: Nov. 15, 2016

(54) METHOD AND APPARATUS FOR GENERATING PIECE-WISE LINEAR REGULATED SUPPLY

(71) Applicant: Texas Instruments Incorporated, Dallas, TX (US)

(72) Inventors: Sumantra Seth, Bangalore (IN); Subrato Roy, Bangalore (IN); Deepak Verma, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 102 days.

(21) Appl. No.: 14/503,545

(22) Filed: Oct. 1, 2014

(65) Prior Publication Data
US 2015/0115929 A1    Apr. 30, 2015

(30) Foreign Application Priority Data

Oct. 25, 2013 (IN) .......................... 4827/CHE/2013

(51) Int. Cl.
*G05F 1/575* (2006.01)
*G11C 5/14* (2006.01)
*H01C 1/16* (2006.01)

(52) U.S. Cl.
CPC ................. *G11C 5/147* (2013.01); *H01C 1/16* (2013.01)

(58) Field of Classification Search
CPC .............. G05F 5/00; G05F 1/56; G05F 1/59; G05F 1/573; G05F 1/575; H02M 3/156–3/157; H02M 3/1588
USPC .......................... 323/269, 274, 280, 281, 303
See application file for complete search history.

(56) References Cited

U.S. PATENT DOCUMENTS

| | | | | |
|---|---|---|---|---|
| 5,479,172 A | * | 12/1995 | Smith | G01S 13/758 342/51 |
| 5,663,919 A | * | 9/1997 | Shirley | G11C 5/14 365/226 |
| 5,747,974 A | * | 5/1998 | Jeon | G05F 1/465 323/269 |
| 8,581,657 B2 | * | 11/2013 | Itoh | G05F 1/56 327/525 |
| 9,053,814 B2 | * | 6/2015 | Lee | G05F 1/56 |
| 9,275,719 B2 | * | 3/2016 | Huang | G11C 5/147 |

* cited by examiner

*Primary Examiner* — Yemane Mehari
(74) *Attorney, Agent, or Firm* — John R. Pessetto; Frank D. Cimino

(57) ABSTRACT

The disclosure provides a voltage regulator for generating piece-wise linear regulated supply voltage. The voltage regulator includes a first clamp circuit that receives a reference voltage and an analog supply voltage. A second clamp circuit receives the reference voltage. A voltage divider circuit is coupled to the first clamp circuit and the second clamp circuit. The voltage divider circuit receives a peripheral supply voltage and generates a regulated supply voltage.

20 Claims, 4 Drawing Sheets

METHOD AND APPARATUS FOR GENERATING PIECE-WISE LINEAR REGULATED SUPPLY

CROSS REFERENCE TO RELATED APPLICATION

This application claims priority from India provisional patent application No. 4827/CHE/2013 filed on Oct. 25, 2013 which is hereby incorporated by reference in its entirety.

TECHNICAL FIELD

The present invention relates to circuits for generating regulated supply voltage, and more particularly, to circuits for generating piece-wise linear regulated supply voltage.

BACKGROUND

Memory arrays are an important component in SOCs. The state of the art application processors and MCU chips have several computing units. Each computing unit has a dedicated memory array. Therefore, the memory arrays occupy a large percentage of area in SOCs. Also, the memory arrays on the SOCs are responsible for around 10% of total power consumption.

A memory array is associated with peripheral logic components. The peripheral logic components receive a peripheral supply voltage. The peripheral supply voltage is provided to a voltage regulator to generate a regulated supply voltage. The regulated supply voltage is provided to a unity gain amplifier to generate a memory supply voltage which is provided to the memory array. The memory supply voltage follows the regulated supply voltage and is adjusted based on the characteristic of the memory array.

Thus, the memory supply voltage has a same profile as the regulated supply voltage. To achieve a best power versus a best performance figure, the regulated supply voltage should be able to scale-up when more performance is desired and scale-down when power is to be reduced. The scaling is required to be performed dynamically with a scaling of the peripheral supply voltage. Thus, a voltage regulator is required that can seamlessly provide such a regulated supply voltage to memory arrays through the unity gain amplifier.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides a voltage regulator. The voltage regulator includes a first clamp circuit that receives a reference voltage and an analog supply voltage. A second clamp circuit receives the reference voltage. A voltage divider circuit is coupled to the first clamp circuit and the second clamp circuit. The voltage divider circuit receives a peripheral supply voltage and generates a regulated supply voltage.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
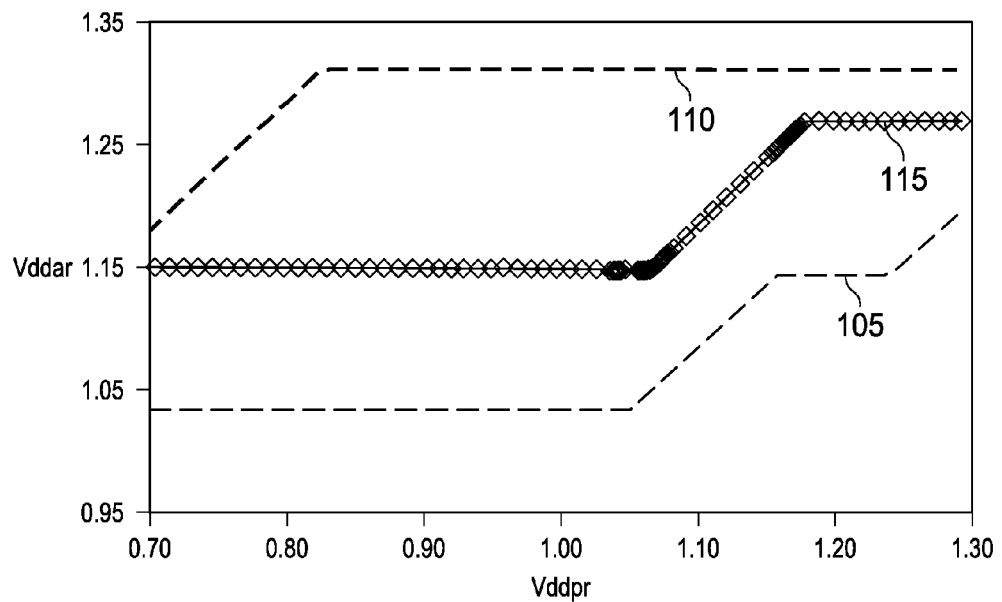
FIG. 1 illustrates a graph of a piece-wise linear relationship between a regulated supply voltage and a peripheral supply voltage.

FIG. 1 illustrates a graph 100 of a piece-wise linear relationship between a regulated supply voltage (Vddar) and a peripheral supply voltage (Vddpr). A memory array is associated with peripheral logic components. The peripheral logic components receive the peripheral supply voltage (Vddpr). The peripheral supply voltage (Vddpr) is provided to a voltage regulator to generate the regulated supply voltage (Vddar).

The regulated supply voltage (Vddar) is provided to a unity gain amplifier to generate a memory supply voltage which is provided to the memory array. The memory supply voltage follows the regulated supply voltage (Vddar) and is adjusted based on the characteristic of the memory array. Thus, the memory supply voltage has a same profile as the regulated supply voltage (Vddar). Therefore, controlling the regulated supply voltage (Vddar) would result in controlling the memory supply voltage.

The peripheral supply voltage (Vddpr), in one example, is a ramp voltage. Curve 115 represents a regulated supply voltage (Vddar) generated by a voltage regulator. Curve 105 represents a minimum voltage required for reliable operation of the memory array across a range of process and temperature variations. The voltage regulator is required to maintain the regulated supply voltage (Vddar) above curve 105.

When the memory array is required to be operated at a higher speed, the peripheral supply voltage (Vddpr) is increased. The voltage regulator detects the increase in the peripheral supply voltage (Vddpr) and provides an increased regulated supply voltage (Vddar). This allows the memory array to operate at a higher speed. Curve 110 represents a reliability limit of the memory array. The regulated supply voltage (Vddar) is maintained below the reliability limit of the memory array.

The data written or read from the memory array passes through the peripheral logic components. Hence, a difference between the peripheral supply voltage (Vddpr) and the regulated supply voltage (Vddar) is maintained equal or below a threshold. A power efficient voltage regulator would generate a regulated supply voltage (Vddar) which is very close to curve 105.

Figure 2:
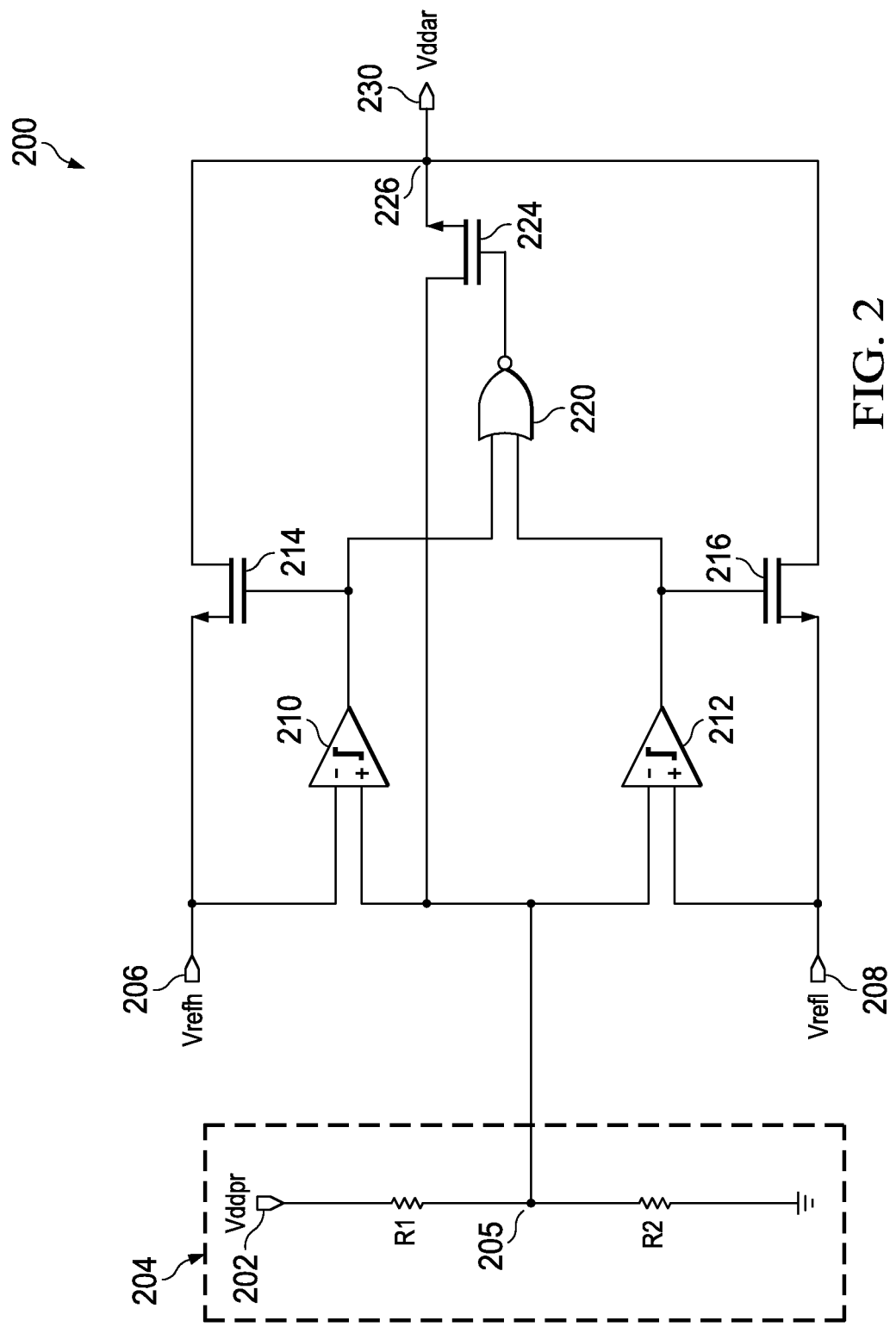
FIG. 2 illustrates a schematic of a voltage regulator.

FIG. 2 illustrates a schematic of a voltage regulator 200. The voltage regulator 200 receives a peripheral supply voltage (Vddpr) 202. The voltage regulator 200 includes a voltage divider circuit 204. The voltage divider circuit 204 includes a first resistor R1 and a second resistor R2. The first resistor R1 is coupled to the second resistor R2 at a node 205. The voltage regulator 200 includes a first comparator 210 and a second comparator 212. A first terminal of the first comparator 210 receives a high reference voltage (Vrefh) 206 and a second terminal of the first comparator 210 is coupled to the node 205.

A first terminal of the second comparator 212 is coupled to the node 205 and a second terminal of the second comparator 212 receives a low reference voltage (Vrefl) 208.

A NOR gate 220 receives an output of the first comparator 210 and an output of the second comparator 212. A first NMOS transistor 214 is coupled to the first comparator 210. A gate terminal of the first NMOS transistor 214 receives the output of the first comparator 210. A source terminal of the first NMOS transistor 214 is coupled to the high reference voltage (Vrefh) 206.

A second NMOS transistor 216 is coupled to the second comparator 212. A gate terminal of the second NMOS transistor 216 receives the output of the second comparator 212. A source terminal of the second NMOS transistor 216 is coupled to the low reference voltage (Vrefl) 208. A gate terminal of a third NMOS transistor 224 is coupled to an output of the NOR gate 220. A drain terminal of the third NMOS transistor 224 is coupled to the node 205.

A source terminal of the third NMOS transistor 224, a drain terminal of the first NMOS transistor 214 and a drain terminal of second NMOS transistor 216 are coupled to form an output node 226. A regulated supply voltage (Vddar) 230 is generated at the output node 226.

The operation of the voltage regulator 200 illustrated in FIG. 2 is explained now. In a first mode, when the peripheral supply voltage (Vddpr) 202 is below a first threshold voltage, the second comparator 212 is activated. The second comparator 212 activates the second NMOS transistor 216 and hence the regulated supply voltage (Vddar) 230 is maintained at the low reference voltage (Vrefl) 208.

In a second mode, when the peripheral supply voltage (Vddpr) 202 goes above a second threshold voltage, the first comparator 210 is activated. The first comparator 210 activates the first NMOS transistor 214 and hence the regulated supply voltage (Vddar) 230 is maintained at the high reference voltage (Vrefh) 206.

In a third mode, when the peripheral supply voltage (Vddpr) 202 is between the first threshold voltage and the second threshold voltage, the third NMOS transistor 224 is activated by the NOR gate 220. Therefore, the regulated supply voltage (Vddar) 230 follows the peripheral supply voltage (Vddpr) 202.

In one version, the regulated supply voltage (Vddar) 230 is provided to a unity gain amplifier to generate a memory supply voltage which is provided to a memory array. The memory supply voltage has a same profile as the regulated supply voltage (Vddar) 230. Therefore, controlling the regulated supply voltage (Vddar) 230 results in controlling the memory supply voltage.

The voltage regulator 200 has several shortcomings. A bandgap circuit is required to provide the high reference voltage (Vrefh) 206 and the low reference voltage (Vrefl) 208. When the voltage regulator 200 transitions from one mode to another, the bandgap circuit glitches which causes noise in the voltage regulator 200.

Also, the transition between the modes is abrupt which causes undesired transitions in the regulated supply voltage (Vddar) 230. In addition, hysteresis in the voltage regulator 200 decreases the efficacy of the voltage regulator 200 to maintain the regulated supply voltage (Vddar) 230 between curve 110 and curve 115 discussed in connection with FIG. 1.

Figure 3:
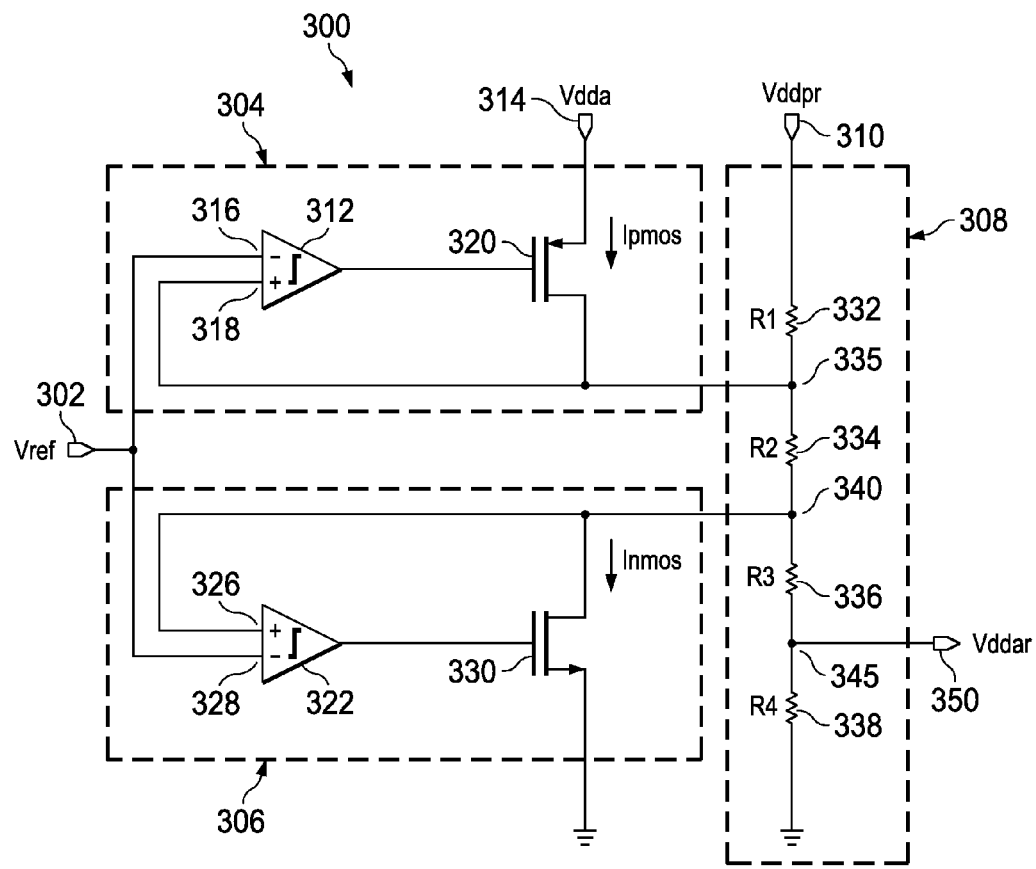
FIG. 3 illustrates a voltage regulator, according to an embodiment.

FIG. 3 illustrates a voltage regulator 300, according to an embodiment. The voltage regulator 300 includes a first clamp circuit 304, a second clamp circuit 306 and a voltage divider circuit 308. The first clamp circuit 304 receives a reference voltage (Vref) 302 and an analog supply voltage (Vdda) 314. The second clamp circuit 306 receives the reference voltage (Vref) 302. The voltage divider circuit 308 is coupled to the first clamp circuit 304 and the second clamp circuit 306. The voltage divider circuit 308 receives a peripheral supply voltage (Vddpr) 310 and generates a regulated supply voltage (Vddar) 350. In one example, the peripheral supply voltage (Vddpr) 310 is a ramp voltage.

The first clamp circuit 304 includes a first amplifier 312 and a PMOS transistor 320. A first terminal 316 of the first amplifier 312 receives the reference voltage (Vref) 302. A second terminal 318 of the first amplifier 312 is coupled to a first node 335 of the voltage divider circuit 308. A gate terminal of the PMOS transistor 320 receives an output of the first amplifier 312. A source terminal of the PMOS transistor 320 receives the analog supply voltage (Vdda) 314. A drain terminal of the PMOS transistor 320 is coupled to the first node 335 of the voltage divider circuit 308.

The second clamp circuit 306 includes a second amplifier 322 and an NMOS transistor 330. A first terminal 328 of the second amplifier 322 receives the reference voltage (Vref) 302. A second terminal 326 of the second amplifier 322 is coupled to a second node 340 of the voltage divider circuit 308. A gate terminal of the NMOS transistor 330 receives an output of the second amplifier 322. A source terminal of the NMOS transistor 330 is coupled to a ground terminal. A drain terminal of the NMOS transistor 330 is coupled to the second node 340 of the voltage divider circuit 308.

The voltage divider circuit 308 includes a first resistor R1 332, a second resistor R2 334, a third resistor R3 336 and a fourth resistor R4 338. The first resistor R1 332 receives the peripheral supply voltage (Vddpr) 310. The second resistor R2 334 is coupled to the first resistor R1 332 at the first node 335. The third resistor R3 336 is coupled to the second resistor R2 334 at the second node 340. A fourth resistor R4 338 is coupled to the third resistor R3 336 at a third node 345. The regulated supply voltage (Vddar) 350 is generated at the third node 345. The voltage regulator 300 may include one or more additional components known to those skilled in the relevant art and are not discussed here for simplicity of the description.

The operation of the voltage regulator 300 illustrated in FIG. 3 is explained now. In a first mode, when the peripheral supply voltage (Vddpr) 310 is equal or below a first threshold voltage, the second clamp circuit 306 is deactivated and the first clamp circuit 304 is activated. When the peripheral supply voltage (Vddpr) 310 is equal or below a first threshold voltage, a voltage at the first node 335 tends to go below the reference voltage (Vref) 302. The first amplifier 312 receives the reference voltage (Vref) 302 and the voltage at the first node 335.

The first amplifier 312 amplifies a difference between the reference voltage (Vref) 302 and the voltage at the first node 335. The PMOS transistor 320 is activated on receiving the output of the first amplifier 312. Thus, a current (Ipmos) flows from the analog supply voltage (Vdda) 314 through the PMOS transistor 320 to maintain the first node 335 of the voltage divider circuit 308 at the reference voltage (Vref) 302. Thus, in the first mode, the first node 335 of the voltage divider circuit 308 is maintained at the reference voltage (Vref) 302.

A voltage at the second node 340 in the first mode is defined as:

$$V_{340} = Vref \times \frac{(R3 + R4)}{(R2 + R3 + R4)} \quad (1)$$

A voltage at the second node 340 is less than the reference voltage (Vref) 302. Thus, the second amplifier 322 is deactivated and hence, the NMOS transistor 330 is deactivated. Therefore, the second clamp circuit 306 is deactivated. The regulated supply voltage (Vddar) 350 generated by the voltage divider circuit 308 is defined as:

$$V_{ddar} = V_{ref} \times \frac{R4}{(R2 + R3 + R4)} \quad (2)$$

In a second mode, when the peripheral supply voltage (Vddpr) 310 is above the first threshold voltage and below a second threshold voltage, the first clamp circuit 304 and the second clamp circuit 306 are deactivated. When the peripheral supply voltage (Vddpr) 310 increases above the first threshold voltage, a voltage at the first node 335 of the voltage divider circuit 308 becomes greater than the reference voltage (Vref) 302. Thus, the first amplifier 312 is deactivated, and hence, the PMOS transistor 320 is deactivated. Therefore, the first clamp circuit 304 is deactivated. The voltage at the first node 335, in the second mode, is defined as:

$$V_{335} = V_{ddpr} \times \frac{(R2 + R3 + R4)}{(R1 + R2 + R3 + R4)} \quad (3)$$

Also, in the second mode, the peripheral supply voltage (Vddpr) 310 is below the second threshold voltage. Therefore, a voltage at the second node 340 becomes less than the reference voltage (Vref) 302. Thus, the second amplifier 322 is deactivated and hence, the NMOS transistor 330 is deactivated. Therefore, the second clamp circuit 306 is deactivated. The voltage at the second node 340, in the second mode, is defined as:

$$V_{340} = V_{ddpr} \times \frac{(R3 + R4)}{(R1 + R2 + R3 + R4)} \quad (4)$$

Hence, the regulated supply voltage (Vddar) 350 generated by the voltage divider circuit 308 is defined as:

$$V_{ddar} = V_{ddpr} \times \frac{R4}{(R1 + R2 + R3 + R4)} \quad (5)$$

Thus, in the second mode, the first node 335 is above the reference voltage (Vref) 302 and the second node 340 is below the reference voltage (Vref) 302. In one example, the peripheral supply voltage (Vddpr) 310 is a ramp voltage between the first threshold voltage and the second threshold voltage. As a result, the regulated supply voltage (Vddar) 350 increases proportionately to the peripheral supply voltage. Thus, the regulated supply voltage (Vddar) 350 is also a ramp voltage.

In a third mode, when the peripheral supply voltage (Vddpr) 310 is equal or above the second threshold voltage, the first clamp circuit 304 is deactivated and the second clamp circuit 306 is activated. When the peripheral supply voltage (Vddpr) 310 is equal or above the second threshold voltage, a voltage at the second node 340 tends to go above the reference voltage (Vref) 302. The second amplifier 322 receives the reference voltage (Vref) 302 and the voltage at the second node 340.

The second amplifier 322 amplifies a difference between the reference voltage (Vref) 302 and the voltage at the second node 340. The NMOS transistor 330 is activated on receiving the output of the second amplifier 322. Thus, a current (Inmos) flows from the second node 340 through the NMOS transistor 330 to maintain the second node 340 of the voltage divider circuit 308 at the reference voltage (Vref) 302. Thus, in the third mode, the second node 340 of the voltage divider circuit 308 is maintained at the reference voltage (Vref) 302.

A voltage at the first node 335 in the third mode is defined as:

$$V_{335} = (V_{ddpr} - V_{ref}) \times \frac{R2}{R1 + R2} + V_{ref} \quad (6)$$

A voltage at the first node 335 is greater than the reference voltage (Vref) 302. Thus, the first amplifier 312 is deactivated, and hence, the PMOS transistor 320 is deactivated. Therefore, the first clamp circuit 304 is deactivated. The regulated supply voltage (Vddar) 350 generated by the voltage divider circuit 308 is defined as:

$$V_{ddar} = V_{ref} \times \frac{R4}{(R3 + R4)} \quad (7)$$

In one version, the regulated supply voltage (Vddar) 350 is provided to a unity gain amplifier to generate a memory supply voltage which is provided to a memory array. The memory supply voltage has a same profile as the regulated supply voltage (Vddar) 350. Therefore, controlling the regulated supply voltage (Vddar) 350 results in controlling the memory supply voltage.

The voltage regulator 300 provides a piece-wise regulated supply voltage based on the peripheral supply voltage (Vddpr) 310. A single reference voltage (Vref) 302 is used by the voltage regulator 300 which eliminates reference voltage generation complexity and top level routings. The transitions between different modes (first mode, second mode and third mode) are smooth and hence no glitches appear at an output of the voltage regulator 300 which is the regulated supply voltage (Vddar) 350.

Since, no switches are used in the voltage regulator 300, switch leakage and capacitive loading on the reference voltage (Vref) 302 is avoided. The voltage regulator 300 provides ease of programming a profile of the regulated supply voltage (Vddar) 350 based on the values of the resistors (R1-R4) used in the voltage divider circuit 308.

The regulated supply voltage (Vddar) 350 is maintained between curves 110 and 105 discussed in FIG. 1. Also, the voltage regulator 300 maintains the regulated supply voltage (Vddar) 350 very close to curve 105 and thus is a power efficient design. The voltage regulator 300 is an analog implementation and hence, the regulated supply voltage (Vddar) 350 is generated continuously based on the peripheral supply voltage (Vddpr).

Figure 4:
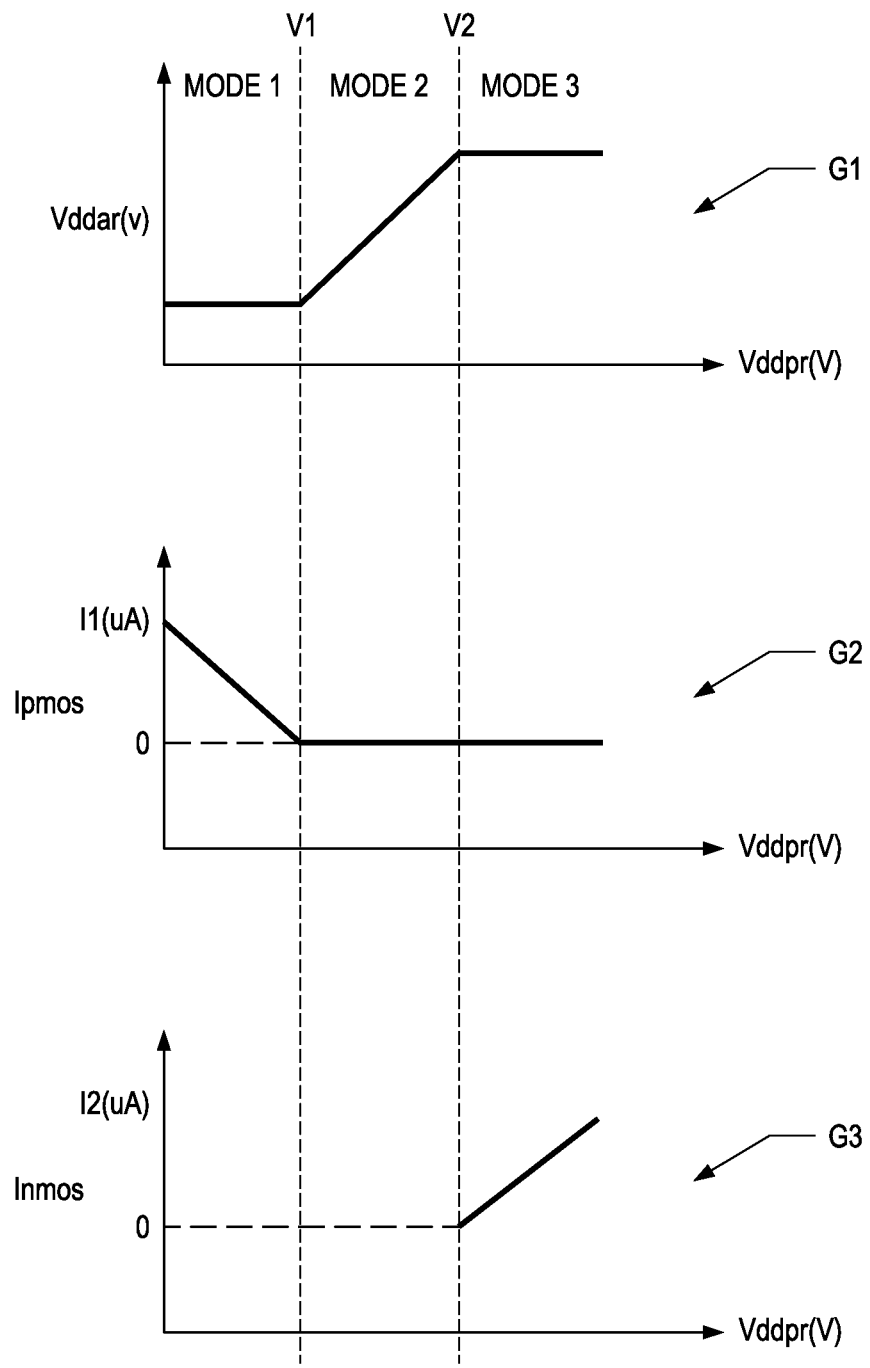
FIG. 4 illustrates characteristic graphs of the voltage regulator illustrated in FIG. 3, according to an embodiment.

FIG. 4 illustrates characteristic graphs of the voltage regulator 300, according to an embodiment. A graph G1 illustrates the regulated supply voltage (Vddar) 350 generated in response to the peripheral supply voltage (Vddpr) 310. The peripheral supply voltage (Vddpr) 310 is increasing in a ramp manner or is a ramp voltage. In the first mode (Mode 1), when the peripheral supply voltage (Vddpr) 310 is increasing, the regulated supply voltage (Vddar) 350 is maintained at a steady level. Also, the second clamp circuit 306 is deactivated and the first clamp circuit 304 is activated. At the first threshold voltage V1, the peripheral supply voltage (Vddpr) 310 is equal to V1. Thus, the first threshold voltage V1 is defined as:

$$V1 = Vref \times \frac{(R1 + R2 + R3 + R4)}{(R2 + R3 + R4)} \quad (8)$$

At the first threshold voltage V1, the voltage regulator 300 transition from the first mode to the second mode (Mode 2). In the second mode, the first clamp circuit 304 and the second clamp circuit 306 are deactivated. The peripheral supply voltage (Vddpr) 310 is a ramp voltage between the first threshold voltage and the second threshold voltage. As a result, the regulated supply voltage (Vddar) 350 increases proportionately to the peripheral supply voltage. Thus, the regulated supply voltage (Vddar) 350 is also a ramp voltage. At the second threshold voltage V2, the peripheral supply voltage (Vddpr) 310 is equal to V2. Thus, the second threshold voltage V2 is defined as:

$$V2 = Vref \times \frac{(R1 + R2 + R3 + R4)}{(R3 + R4)} \quad (9)$$

At the second threshold voltage V2, the voltage regulator 300 transition from the second mode to the third mode (Mode 3). In the third mode, when the peripheral supply voltage (Vddpr) 310 in increasing, the regulated supply voltage (Vddar) 350 is maintained at a steady level. Also, the second clamp circuit 306 is activated and the first clamp circuit 304 is deactivated.

A graph G2 illustrates a current (Ipmos) generated in the PMOS transistor 320 in response to the peripheral supply voltage (Vddpr) 310. In the first mode (mode 1), a current flows from the analog supply voltage (Vdda) 314 through the PMOS transistor 320 to maintain the first node 335 of the voltage divider circuit 308 at the reference voltage (Vref) 302. In the second mode and the third mode, the first clamp circuit 304 is deactivated and hence, the PMOS transistor 320 is deactivated.

A graph G3 illustrates a current (Inmos) generated in the NMOS transistor 330 in response to the peripheral supply voltage (Vddpr) 310. In the third mode (mode 3), a current flows from the second node 340 through the NMOS transistor 330 to maintain the second node 340 of the voltage divider circuit 308 at the reference voltage (Vref) 302. In the first mode and the second mode, the second clamp circuit 306 is deactivated and hence, the NMOS transistor 330 is deactivated.

Figure 5:
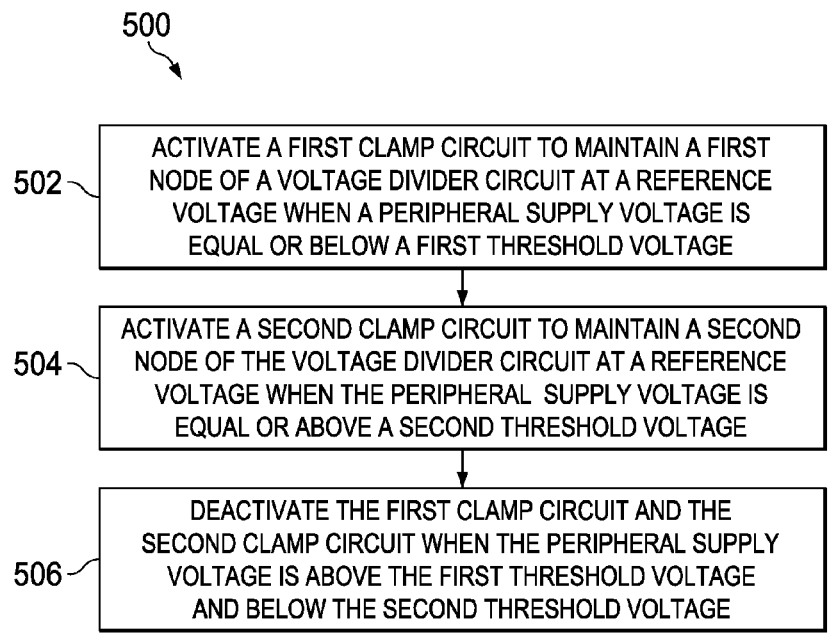
FIG. 5 illustrates a method of generating a regulated supply voltage, according to an embodiment.

FIG. 5 illustrates a method 500 of generating a regulated supply voltage, according to an embodiment. At step 502, a first clamp circuit is activated to maintain a first node of a voltage divider circuit at a reference voltage when a peripheral supply voltage is equal or below a first threshold voltage. A second clamp circuit is deactivated when the peripheral supply voltage is equal or below a first threshold voltage.

The first clamp circuit and the second clamp circuit receive the reference voltage. Also, the first clamp circuit receives the analog supply voltage. The first clamp circuit is coupled to a voltage divider circuit at a first node. The second clamp circuit is coupled to the voltage divider circuit at a second node. The voltage divider circuit receives the peripheral supply voltage. The regulated supply voltage is generated at a third node of the voltage divider circuit.

At step 504, a second clamp circuit is activated to maintain the second node of the voltage divider circuit at a reference voltage when the peripheral supply voltage is equal or above a second threshold voltage. The first clamp circuit is deactivated when the peripheral supply voltage is equal or above a second threshold voltage.

At step 506, the first clamp circuit and the second clamp circuit are deactivated when the peripheral supply voltage is above the first threshold voltage and below the second threshold voltage. When the peripheral supply voltage is above the first threshold voltage and below the second threshold voltage, the first node of the voltage divider circuit is above the reference voltage and the second node of the voltage divider circuit is below the reference voltage. In one example, the peripheral supply voltage is a ramp voltage between the first threshold voltage and the second threshold voltage. The regulated supply voltage increases proportionately to the peripheral supply voltage such that the regulated supply voltage is a ramp voltage.

Figure 6:
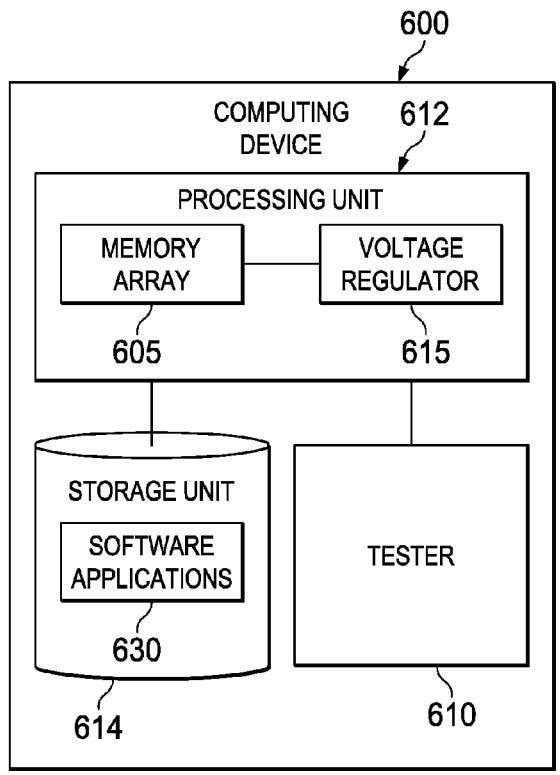
FIG. 6 illustrates a computing device, according to an embodiment.

FIG. 6 illustrates a computing device 600, according to an embodiment. The computing device 600 is, or is incorporated into, a mobile communication device, such as a mobile phone, a personal digital assistant, a personal computer, or any other type of electronic system.

In some embodiments, the computing device 600 comprises a megacell or a system-on-chip (SOC) which includes control logic such as a processing unit 612 (Central Processing Unit), a storage unit 614 (e.g., random access memory (RAM)) and a tester 610. The processing unit 612 can be, for example, a CISC-type (Complex Instruction Set Computer) CPU, RISC-type CPU (Reduced Instruction Set Computer), or a digital signal processor (DSP). The storage unit 614 (which can be memory such as RAM, flash memory, or disk storage) stores one or more software application 630 (e.g., embedded applications) that, when executed by the processing unit 612, perform any suitable function associated with the computing device 600.

The tester 610 comprises logic that supports testing and debugging of the computing device 600 executing the software application 630. For example, the tester 610 can be used to emulate a defective or unavailable component(s) of the computing device 600 to allow verification of how the component(s), were it actually present on the computing device 600, would perform in various situations (e.g., how the component(s) would interact with the software application 630). In this way, the software application 630 can be debugged in an environment which resembles post-production operation.

The processing unit 612 includes a memory array 605 which store information frequently accessed by the processing unit 612. The memory array 605 is a memory such as SRAM, DDR memory or flash memory. A voltage regulator 615 is coupled to the memory array 605. In one example, the voltage regulator 615 is placed outside of the processing unit 612. The computing device 600 can have one or more voltage regulator 615 providing a regulated supply voltage to one or more components of the computing device 600.

The voltage regulator 615 is similar to the voltage regulator 300 (illustrated in FIG. 3) in connection and operation. The voltage regulator 615 includes a first clamp circuit, a second clamp circuit and a voltage divider circuit. The voltage divider circuit receives a peripheral supply voltage and generates a regulated supply voltage.

In one version, the regulated supply voltage from the voltage regulator 615 is provided to the memory array 605.

In another version, the regulated supply voltage is provided to a unity gain amplifier to generate a memory supply voltage which is provided to the memory array 605. The memory supply voltage has a same profile as the regulated supply voltage.

The voltage regulator 615 provides a piece-wise regulated supply voltage to the memory array 605 based on the peripheral supply voltage. A single reference voltage (Vref) is used by the voltage regulator 300 which eliminates reference voltage generation complexity and top level routings in the voltage regulator 615. The transitions between different modes are smooth and hence no glitches appear in the regulated supply voltage. The voltage regulator 615 provides ease of programming a profile of the regulated supply voltage based on the values of the resistors used in the voltage divider circuit.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections.

Further, the term "high" is generally intended to describe a signal that is at logic "1," and the term "low" is generally intended to describe a signal that is at logic "0." The term "on" applied to a transistor or group of transistors is generally intended to describe gate biasing to enable current flow through the transistor or transistors. Also, the terms "inactivation" or "inactivated" or turn "OFF" or turned "OFF" is used to describe a deactivation of a device, a component or a signal. The terms "activation" or "activated" or turned "ON" describes activation of a device, a component or a signal.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A voltage regulator comprising:
   a first clamp circuit configured to receive a reference voltage and an analog supply voltage;
   a second clamp circuit configured to receive the reference voltage, and
   a voltage divider circuit coupled to the first clamp circuit and the second clamp circuit, the voltage divider circuit configured to receive a peripheral supply voltage and configured to generate a regulated supply voltage.

2. The voltage regulator of claim 1, wherein the first clamp circuit comprises:
   a first amplifier whose first terminal is configured to receive the reference voltage; and
   a PMOS transistor whose source terminal is configured to receive the analog supply voltage and whose gate terminal is configured to receive an output of the first amplifier, wherein a second terminal of the first amplifier and a drain terminal of the PMOS transistor are coupled to a first node of the voltage divider circuit.

3. The voltage regulator of claim 1, wherein the second clamp circuit comprises:
   a second amplifier whose first terminal is configured to receive the reference voltage; and
   an NMOS transistor whose source terminal is coupled to a ground terminal and whose gate terminal is configured to receive an output of the second amplifier, wherein a second terminal of the second amplifier and a drain terminal of the NMOS transistor are coupled to a second node of the voltage divider circuit.

4. The voltage regulator of claim 1, wherein the voltage divider circuit comprises:
   a first resistor configured to receive the peripheral supply voltage;
   a second resistor coupled to the first resistor at the first node;
   a third resistor coupled to the second resistor at the second node; and
   a fourth resistor coupled to the third resistor at a third node, wherein the regulated supply voltage is generated at the third node.

5. The voltage regulator of claim 1, wherein when the peripheral supply voltage is equal or below a first threshold voltage, the second clamp circuit is deactivated and the first clamp circuit is activated to maintain the first node at the reference voltage.

6. The voltage regulator of claim 1, wherein when the peripheral supply voltage is above the first threshold voltage and below a second threshold voltage, the first clamp circuit and the second clamp circuit are deactivated such that the first node is above the reference voltage and the second node is below the reference voltage.

7. The voltage regulator of claim 6, wherein the peripheral supply voltage is a ramp voltage between the first threshold voltage and the second threshold voltage, and the regulated supply voltage increases proportionately to the peripheral supply voltage such that the regulated supply voltage is a ramp voltage.

8. The voltage regulator of claim 1, wherein when the peripheral supply voltage is equal or above the second threshold voltage, the first clamp circuit is deactivated and the second clamp circuit is activated to maintain the second node at the reference voltage.

9. A method of generating a regulated supply voltage comprising:
   activating a first clamp circuit to maintain a first node of a voltage divider circuit at a reference voltage when a peripheral supply voltage is equal or below a first threshold voltage;
   activating a second clamp circuit to maintain a second node of the voltage divider circuit at a reference voltage when the peripheral supply voltage is equal or above a second threshold voltage; and
   deactivating the first clamp circuit and the second clamp circuit when the peripheral supply voltage is above the first threshold voltage and below the second threshold voltage.

10. The method of claim 9 further comprising:
    deactivating the second clamp circuit when the peripheral supply voltage is equal or below the first threshold voltage; and deactivating the first clamp circuit when the peripheral supply voltage is equal or above the first threshold voltage.

11. The method of claim 9, wherein the first clamp circuit is coupled to a voltage divider circuit at a first node, and the second clamp circuit is coupled to the voltage divider circuit at a second node, the voltage divider circuit configured to receive the peripheral supply voltage.

12. The method of claim 9, wherein when the peripheral supply voltage is above the first threshold voltage and below the second threshold voltage, the first node is above the reference voltage and the second node is below the reference voltage.

13. The method of claim 12, wherein the peripheral supply voltage is a ramp voltage between the first threshold voltage and the second threshold voltage, and the regulated supply voltage increases proportionately to the peripheral supply voltage such that the regulated supply voltage is a ramp voltage.

14. The method of claim 9 further comprising generating the regulated supply voltage at a third node of the voltage divider circuit.

15. The method of claim 9 further comprising receiving the reference voltage by the first clamp circuit and the second clamp circuit, and receiving an analog supply voltage by the first clamp circuit.

16. A computing device comprising a processing unit, the processing unit further comprising:
a memory array; and
a voltage regulator coupled to the memory array, the voltage regulator comprising:
a first clamp circuit configured to receive a reference voltage and an analog supply voltage;
a second clamp circuit configured to receive the reference voltage, and
a voltage divider circuit coupled to the first clamp circuit and the second clamp circuit, the voltage divider circuit configured to receive a peripheral supply voltage and configured to generate a regulated supply voltage.

17. The computing device of claim 16, wherein the first clamp circuit is coupled to the voltage divider circuit at a first node, and the second clamp circuit is coupled to the voltage divider circuit at a second node.

18. The computing device of claim 16, wherein when the peripheral supply voltage is equal or below a first threshold voltage, the second clamp circuit is deactivated and the first clamp circuit is activated to maintain the first node at the reference voltage.

19. The computing device of claim 16, wherein when the peripheral supply voltage is above the first threshold voltage and below a second threshold voltage, the first clamp circuit and the second clamp circuit are deactivated such that the first node is above the reference voltage and the second node is below the reference voltage.

20. The computing device of claim 16, wherein when the peripheral supply voltage is equal or above the second threshold voltage, the first clamp circuit is deactivated and the second clamp circuit is activated to maintain the second node at the reference voltage.

* * * * *